(12) United States Patent
Lee

(10) Patent No.: US 7,989,874 B2
(45) Date of Patent: Aug. 2, 2011

(54) NONVOLATILE MEMORY DEVICE AND METHOD FOR MANUFACTURING THE SAME

(75) Inventor: Da-Soon Lee, Chungcheongbuk-do (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 175 days.

(21) Appl. No.: 11/275,494

(22) Filed: Jan. 10, 2006

(65) Prior Publication Data

US 2006/0102951 A1     May 18, 2006

Related U.S. Application Data

(62) Division of application No. 10/982,005, filed on Nov. 4, 2004, now Pat. No. 7,118,962.

(30) Foreign Application Priority Data

Nov. 5, 2003 (KR) .................. 10-2003-0078099

(51) Int. Cl.
*H01L 29/788* (2006.01)
(52) U.S. Cl. .................................... 257/317; 257/E29.3
(58) Field of Classification Search .................. None
See application file for complete search history.

(56) References Cited

U.S. PATENT DOCUMENTS

| | | | | |
|---|---|---|---|---|
| 5,517,044 A * | 5/1996 | Koyama | ......................... | 257/316 |
| 5,990,507 A * | 11/1999 | Mochizuki et al. | ........... | 257/295 |
| 6,020,229 A | 2/2000 | Yamane et al. | | |
| 6,078,521 A | 6/2000 | Madurawe et al. | | |
| 6,380,585 B1 | 4/2002 | Odanaka et al. | | |
| 6,420,749 B1 * | 7/2002 | Divakaruni et al. | .......... | 257/301 |
| 6,627,943 B2 | 9/2003 | Shin et al. | | |
| 6,667,211 B2 * | 12/2003 | Watanabe | ..................... | 438/259 |
| 7,436,703 B2 * | 10/2008 | Pham et al. | ............... | 365/185.05 |
| 2003/0089961 A1 * | 5/2003 | Vollrath et al. | ............... | 257/510 |
| 2003/0127681 A1 * | 7/2003 | Nishioka et al. | .............. | 257/315 |
| 2003/0148558 A1 * | 8/2003 | Kubo et al. | ................... | 438/128 |

* cited by examiner

*Primary Examiner* — Benjamin P Sandvik
(74) *Attorney, Agent, or Firm* — Marshall, Gerstein & Borun LLP

(57) ABSTRACT

The present invention discloses a nonvolatile memory device which can improve the data storage capacity without increasing the surface area of the device, and a method for manufacturing the same. The nonvolatile memory device comprises: a gate of a stack type structure formed on an active region of a semiconductor substrate; a source/drain formed in the substrate at both sides of the gate of the stack type structure; an interlayer insulating film formed on the substrate where the source/drain is formed and covering the gate of the stack type structure; a contact connected to the source/drain through the interlayer insulating film; a plurality of conductive patterns formed in the interlayer insulating film of the region not adjacent to the contact; and an electrode pad formed on the conductive patterns.

5 Claims, 7 Drawing Sheets

NONVOLATILE MEMORY DEVICE AND METHOD FOR MANUFACTURING THE SAME

CROSS-REFERENCE TO RELATED APPLICATION

This patent is a divisional of U.S. patent application Ser. No. 10/982,005, filed Nov. 4, 2004.

BACKGROUND OF THE INVENTION

1. Field of the Invention

The present invention relates to a nonvolatile memory device and a method for manufacturing the same, and more particularly, to a nonvolatile memory device which can improve the data storage capacity without increasing the surface area of the device, and a method for manufacturing the same.

2. Description of the Related Art

Generally, non-volatile memory devices are memory apparatuses that can retain their previous data even though their power supplies are interrupted. The nonvolatile memory device has a stack type gate structure comprising a floating gate formed by interposing an oxide film for F—N tunneling on the top of a semiconductor substrate and a control gate formed by interposing an interlayer insulating film on the top of the floating gate. These non-volatile memory devices include EPROMs capable of being electrically programmed and erased through the irradiation of a UV light and EEPROMs capable of being electrically programmed and erased.

The most important characteristic of the nonvolatile memory device is the data storage characteristic by which data programmed in the memory device can be retained for a long time.

However, in the nonvolatile memory device having a stack type gate structure in accordance with the prior art, floating and control gates are formed on a substrate and then an oxide film for insulating them from other devices is formed thereon.

Here, the oxide film contains migratory ions such as Na+ and $H_2O$ inside. Accordingly, there arouses a problem that, in the proceeding of various processes such as deposition, etching, etc., migratory ions and $H_2O$ are accumulated on an adjacent floating gate to form a data leakage path. As a result, the data programmed in the floating gate is lost along the leakage path to thus deteriorate the data storage capacity.

Accordingly, as a method for overcoming the problem, recently, there have been conducted studies on a method for gathering migratory ions for preventing migratory ions contained in an oxide film of a nonvolatile memory device.

Hereinafter, the method for gathering migratory ions in accordance with the prior art will be described with reference to the accompanying drawings.

FIG. 1 is a sectional view schematically showing the structure of a nonvolatile memory device for explaining a method for gathering migratory ions in accordance with one example of the prior art.

As shown therein, in the nonvolatile memory device in accordance with the example of the prior art, a semiconductor substrate 100 is divided into an active region and an inactive region by a device isolation film 110, a floating gate 120 and a control gate 130 are formed on the active region of the semiconductor substrate 100, and an oxide film 170 for insulating these gates from a top metal wire 180 is formed thereon. Besides, a nitride film 140 surrounding the outer walls of the floating gate 120 and control gate 130 is disposed between the floating gate 120 and control gate 130 and the oxide film 170.

The nitride film 140 gathers migratory ions contained in the oxide film 170 flowing into the floating gate in a process such as deposition or etching conducted after the formation of the oxide film 170, and, at the same time, avoids $H_2O$ contained in the oxide film 170 from penetrating into the floating gate to prevent the leakage of data programmed in the floating gate. That is, the data storage capacity of the nonvolatile memory device can be improved.

However, although the nitride film 140 plays the role of gathering migratory ions and preventing the penetration of $H_2O$, the nitride film 140 is formed under an atmosphere containing a lot of H+ ions, to thus bring about a problem that the loss of data storage capacity occurs due to H+. Further, the nitride film gets a bigger stress on films than an oxide film does, this brings about a problem of occurring a bigger loss of data storage due to the stress of the nitride film.

Subsequently, in the prior art, not a nitride film but a PSG film is used as a film for gathering migratory ions. Hereinafter, a method for gathering migratory ions using a PSG film will be described with reference to the accompanying drawings.

FIG. 2 is a sectional view schematically showing the structure of a nonvolatile memory device for explaining a method for gathering migratory ions in accordance with another example of the prior art.

As shown therein, in the nonvolatile memory device in accordance with the another example of the prior art, a floating gate 120 and a control gate 130 are formed on an active region of a semiconductor substrate 100 divided into the active region and an inactive region by a device isolation film 110, and an oxide film 170 including a PSG film 150 is disposed between films on these gates, to thus insulate the floating gate 120 and the control gate 130 from a top metal wire 180.

At this time, the PSG film 150 disposed in the oxide film 170 is high in the concentration of phosphorous. Accordingly, in a process such as deposition or etching after the formation of the oxide film 170, Na+ ions are gathered from the migratory ions contained in the oxide film 170 accumulated to the floating gate, thereby preventing the leakage of data programmed in the floating gate 120.

However, the PSG film 150 has a high gathering rate of Na+ ions of the migratory ions contained in the oxide film, but has a low gathering rate of other migratory ions. As a result, the remaining migratory ions excluding Na+ ions are penetrated into the floating gate 120 to form a data leakage path, thereby bringing out a problem that the data programmed in the floating gate 120 is lost through the data leakage path.

SUMMARY OF THE INVENTION

The present invention is designed in consideration of the problems of the prior art, and therefore it is an object of the present invention to provide a nonvolatile memory device which can avoid the generation of a data leakage path due to migratory ions by gathering the migratory ions contained in an oxide film for insulating a floating gate and a control gate.

To achieve the above object, there is provided a nonvolatile memory device in accordance with the present invention, comprising: a gate of a stack type structure formed on an active region of a semiconductor substrate; a source/drain formed in the substrate at both sides of the gate of the stack type structure; an interlayer insulating film formed on the substrate where the source/drain is formed and covering the gate of the stack type structure; a contact connected to the source/drain through the interlayer insulating film; a plurality of conductive patterns formed in the interlayer insulating film of the region not adjacent to the contact; and an electrode pad formed on the conductive patterns.

Preferably, the gate of the stack type structure has a structure in which a floating gate and a control gate are sequentially stacked.

Preferably, the interlayer insulating film is formed of an oxide film, and the conductive pattern contains P ions.

To achieve the above object, there is provided a method for manufacturing a nonvolatile memory device in accordance with the present invention, comprising: forming gates of a stack type structure on an active region of a semiconductor substrate; forming a source/drain in the substrate at both sides of the gate of the stack type structure; forming a first interlayer insulating film on the entire surface of substrate where the source/drain is formed; forming a plurality of trenches having a predetermined depth in the first interlayer insulating film of the region not adjacent to a contact forming region; depositing a conductive material on the entire surface of the substrate where the trenches are formed; forming a conductive pattern by selectively etching the conductive material; forming a second interlayer insulating film on the first interlayer insulating film where the conductive pattern is formed; forming a first contact hole connecting to parts of the source/drain and a second contact hole connecting to the conductive pattern by selectively etching the second interlayer insulating film; and forming an electrode pad and a contact by burying the first contact hole and the second contact hole with a conductive material.

Preferably, the gate of the stack type structure has a structure in which a floating gate and a control gate are sequentially stacked.

Preferably, the second interlayer insulating film is formed using a BPSG film, and the conductive pattern is formed in the region corresponding to the trenches.

BRIEF DESCRIPTION OF THE DRAWINGS

Other objects and aspects of the present invention will become apparent from the following description of embodiments with reference to the accompanying drawings in which.

DESCRIPTION OF THE PREFERRED EMBODIMENT

Figure 1:
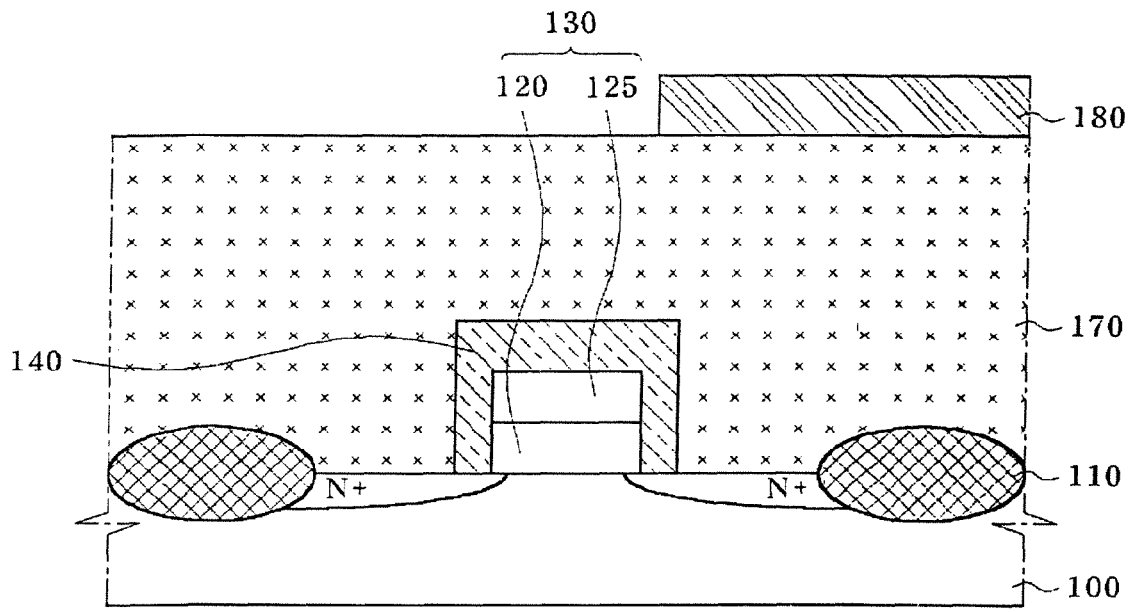
FIG. 1 is a sectional view schematically showing the structure of a nonvolatile memory device for explaining a method for gathering migratory ions in accordance with one example of the prior art.
Figure 2:
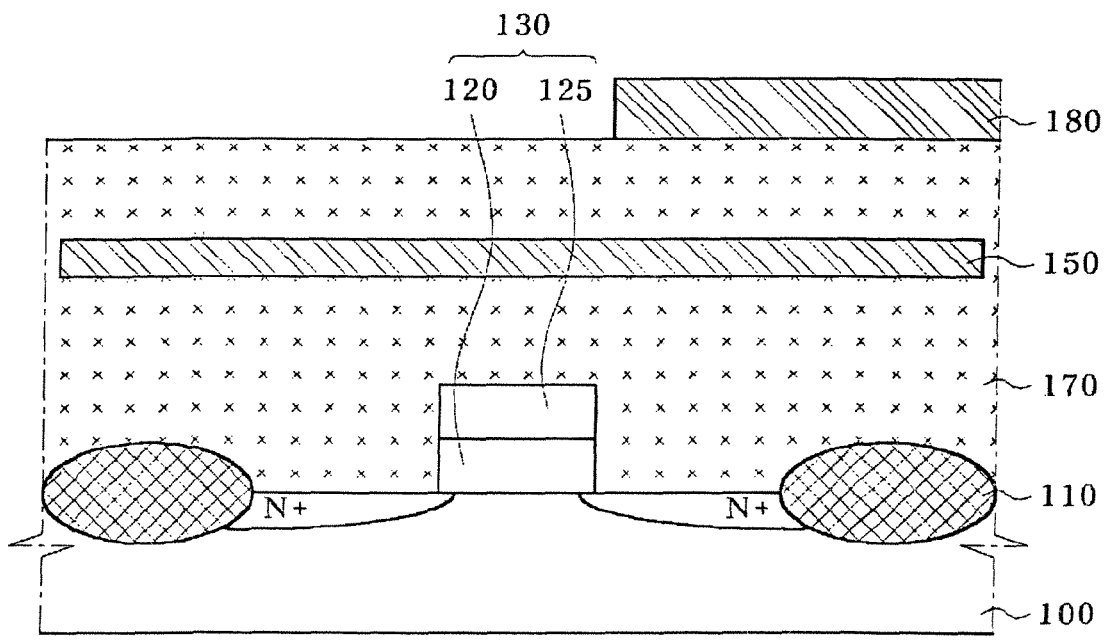
FIG. 2 is a sectional view schematically showing the structure of a nonvolatile memory device for explaining a method for gathering migratory ions in accordance with another example of the prior art.

Hereinafter, a preferred embodiment of the present invention will be described in more detail referring to the drawings.

In the drawings, a plurality of layers and regions are shown at an enlarged thickness for a clear description thereof. Throughout the specification, the same reference numerals are used for the same components.

First, the structure of the nonvolatile memory device in accordance with a preferred embodiment of the present invention will be described with reference to FIG. 3.

Figure 3:
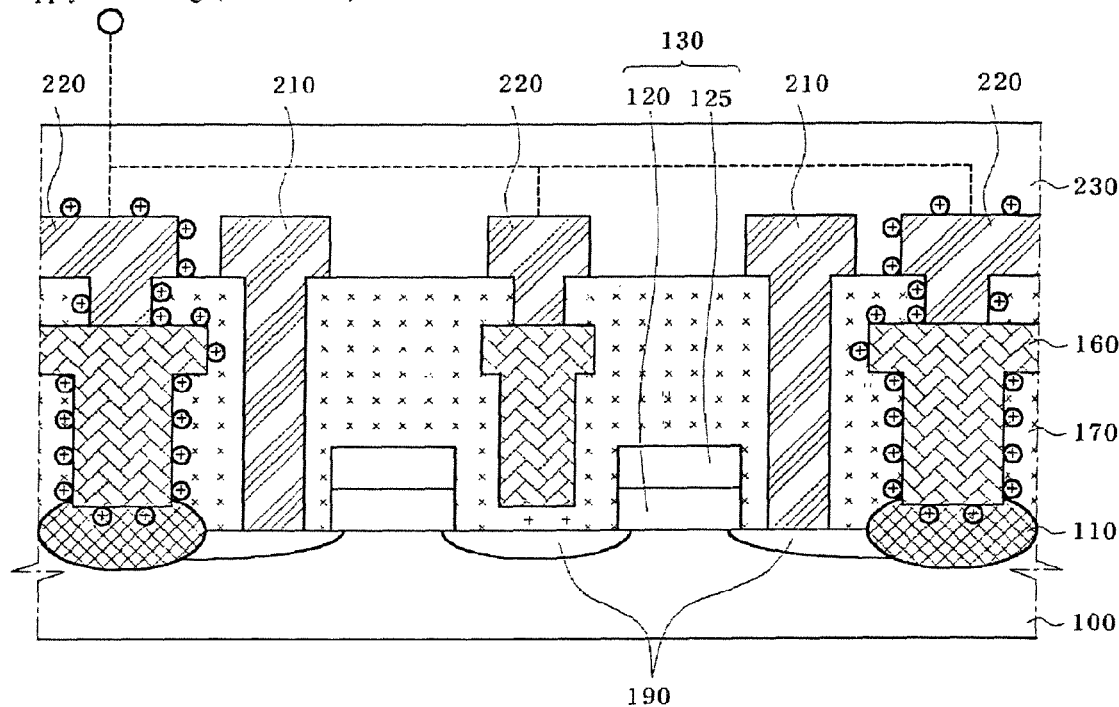
FIG. 3 is a sectional view showing the structure of a nonvolatile memory device in accordance with a preferred embodiment of the present invention.

FIG. 3 is a sectional view showing the structure of a nonvolatile memory device in accordance with the preferred embodiment of the present invention.

As shown in FIG. 3, an active region and an inactive region are defined on a semiconductor substrate 100 by a device isolation film 110, and a plurality of gates 130 of a stack type structure are formed on the active region. At this time, the gate 130 of the stack type structure is formed by sequentially stacking the floating gate 120 and the control gate 125.

A source/drain 190, which is a junction, is formed in the substrate 100 at both sides of the gate 130 of the stack type structure.

An interlayer insulating film 170 formed of an oxide film is formed on the gate 130 of the stack type structure. This interlayer insulating film 170 plays the role of insulating the gate 130 of the stack type structure from other devices. Here, the interlayer insulating film 170 is formed of an oxide film and contains migratory ions such as Na+.

In addition, the interlayer insulating film 170 includes a contact 210 electrically connecting the source/drain 190 and an upper electrode (not shown) through the interlayer insulating film 170 and a conductive pattern 160 formed in the interlayer insulating film 170, and an electrode pad 220 for applying a voltage to the conductive pattern 160 from the outside is formed on the conductive pattern 160. Here, the conductive pattern 160 is made of a conductive material, and gathers migratory ions contained in the interlayer insulating film 170 formed of an oxide film when a voltage is applied through the electrode pad 220.

More specifically, if a negative voltage of about −10 to −20V is applied to the conductive pattern 160 disposed in the interlayer insulating film 170 under a temperature condition of 250 to 450° C., the conductive pattern 160 gathers migratory ions around it. Accordingly, the phenomenon that migratory ions move to the floating gate 120 is prevented. That is, the generation of a data leakage path of the floating gate 120 due to the migratory ions is avoided to thus minimize the loss of data programmed in the floating gate. Further, upon driving a device after the subsequent packaging process, if a negative voltage of −3 to −5V is continuously applied through the electrode pad 220 connected to the conductive pattern 160, the migratory ions gathered in the conductive pattern 160 continues to gather therein. Thus, the phenomenon that migratory ions move to the floating gate 120 is prevented to thereby completely prevent the loss of data programmed in the floating gate.

Next, a method for manufacturing a nonvolatile memory device in accordance with the preferred embodiment of the present invention will be described with reference to FIGS. 4a to 4j and FIG. 3.

FIGS. 4a to 4j are process sectional views sequentially showing and explaining a method for manufacturing a nonvolatile memory device in accordance with the preferred embodiment of the present invention.

Figure 4A:
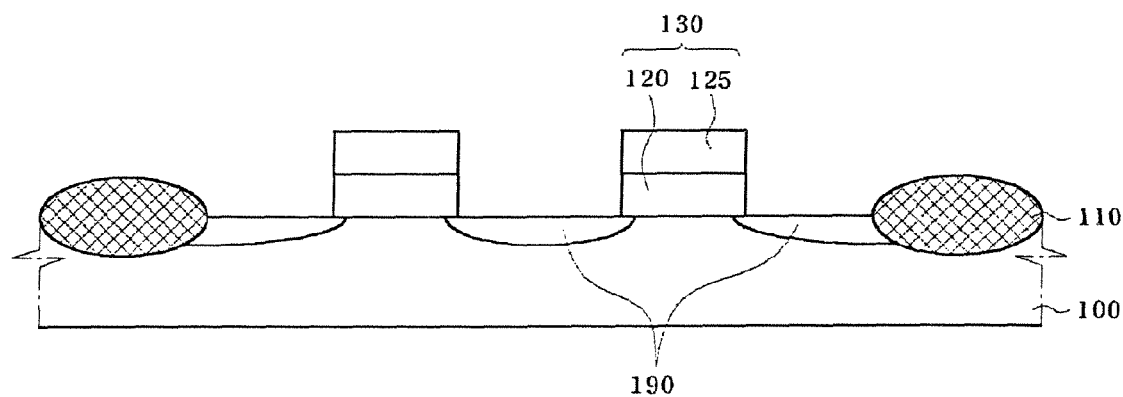
FIGS. 4a to 4j are process sectional views sequentially showing and explaining a method for manufacturing a nonvolatile memory device in accordance with the preferred embodiment of the present invention.

First, as shown in FIG. 4a, a device isolation film 110 defining an active region and an inactive region is formed on a semiconductor substrate 100.

Then, a plurality of gates 130 of a stack type structure in which a floating gate 120 and a control gate 125 are sequentially stacked are formed on the active region of the semiconductor substrate 100. Using these gates as an ion implanting mask, ions for source/drain are implanted into the substrate 100 corresponding to the active region to form a source/drain 190 which is a junction.

Figure 4B:
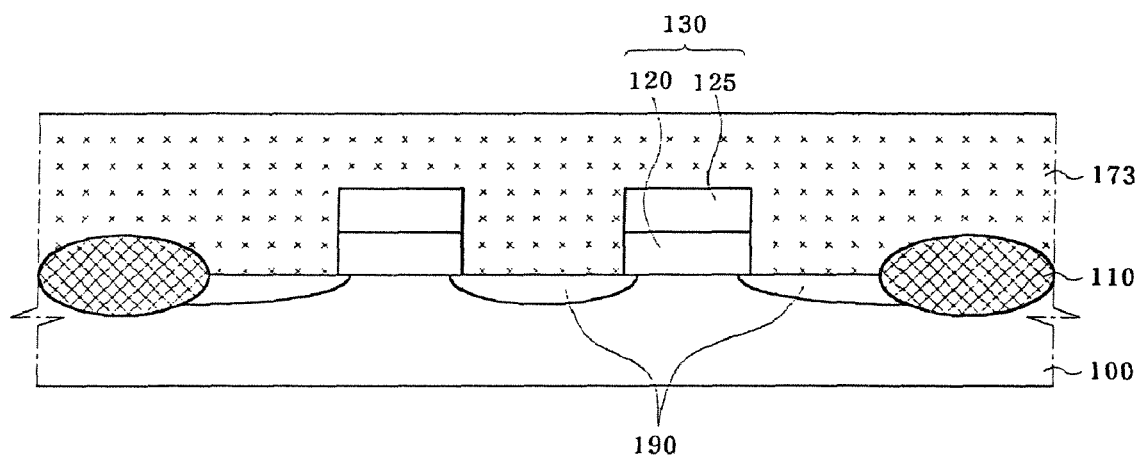

Continually, as shown in FIG. 4b, a first interlayer insulating film 173 is formed on the entire surface of the substrate 100 having the source/drain 190 formed thereto. The first interlayer insulating film 173 is formed of an oxide film at a large thickness so that the gate 130 of the stack type structure can be completely buried. At this time, the oxide film contains migratory ions such as Na+, thus the interlayer insulating film 173 formed of an oxide film also contains migratory ions.

However, the migratory ions contained in the first interlayer insulating film 173 are problematic in that, in the subsequent process, they are accumulated in the floating gate 120 to bring out a data leakage path.

Accordingly, in order to solve the above-described problem, a conductive pattern capable of gathering migratory ions is formed in the first interlayer insulating film 173.

Hereinafter, a method for forming a conductive pattern will be described in detail with reference to FIGS. 4c to 4f.

Figure 4C:
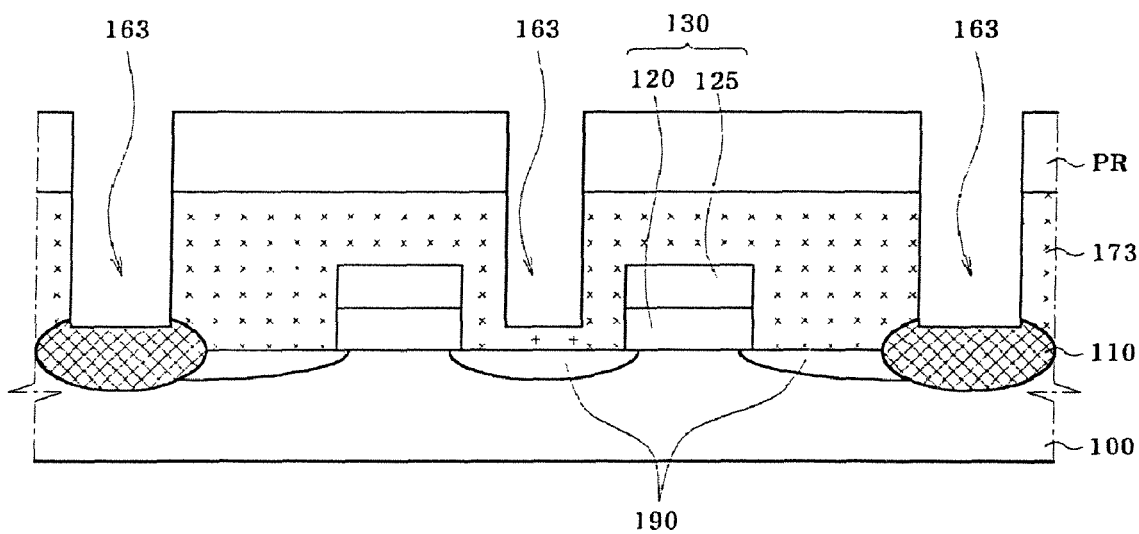

First, as shown in FIG. 4c, a photosensitive film pattern PR defining a trench forming region is formed on the first interlayer insulating film 173. Preferably, the trench forming region is defined as a region not adjacent to a contact forming region. The reason of which is because a trench is a region where a subsequent conductive pattern is formed, and, in case that the contact forming region and the trench forming region are adjacent, thereby arousing a problem that a contact and a conductive pattern may be short-circuited.

Using the photosensitive film pattern defining the trench forming region as a mask, parts of the first interlayer insulating film 173 is etched to form a plurality of trenches 163. Here, the trenches 163 play the role of increasing the contact surface area of the conductive pattern contacting the first interlayer insulating film by the subsequent process.

Figure 4D:
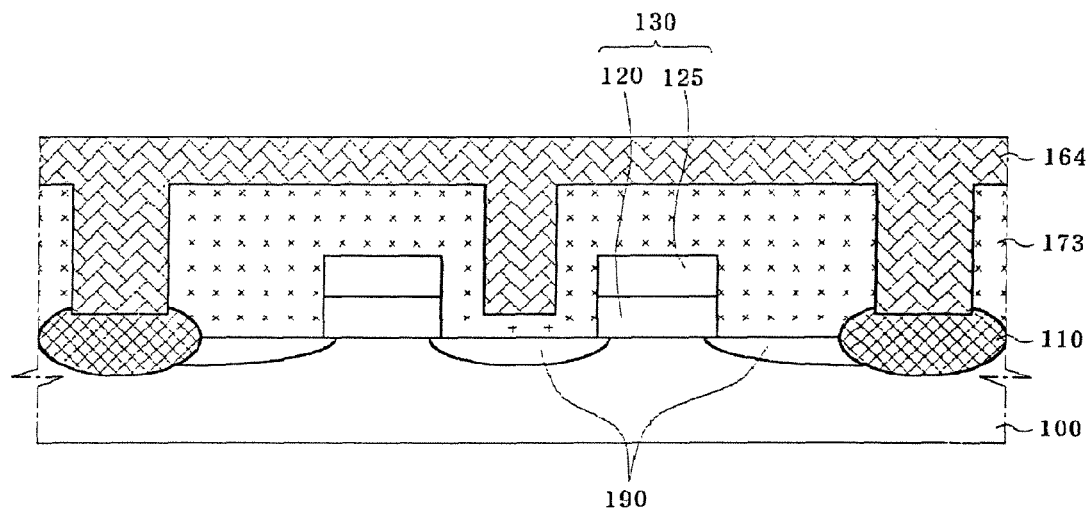

Next, as shown in FIG. 4d, a conductive material 164 is formed on the entire surface of the substrate 100 from which the photosensitive film pattern defining a conductive pattern forming region is removed so that the trenches can be completely buried.

Figure 4E:
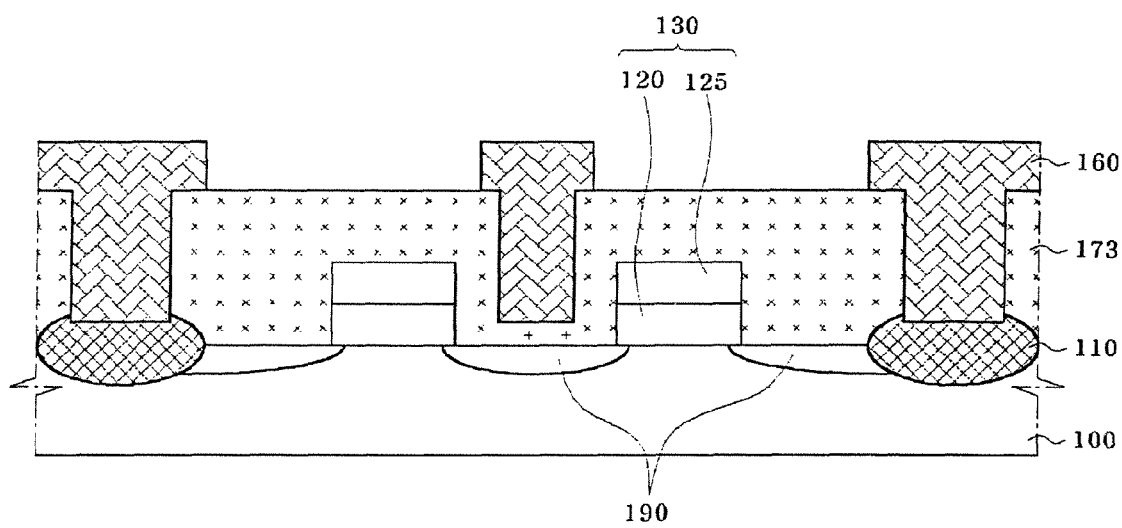

Continuously, as shown in FIG. 4e, the conductive material of the region required for wiring the gate 130 of the stack type structure and the source/drain 190, that is, the region corresponding to the contact forming region, is removed by a photographic etching process to form a conductive pattern 160. Here, the conductive pattern 160 is formed by burying the trench with a conductive material. Preferably, in order to increase the contact surface area of the first interlayer insulating film 173, the top part of the first interlayer insulating film 173 corresponding to the region not adjacent to the contact forming region is left as it is to increase the gathering efficiency. Further, the migratory ion removal efficiency of the conductive pattern 60 can be increased by doping the conductive pattern 160 with $POCL_3$ or doping the same with phosphorous.

Figure 4F:
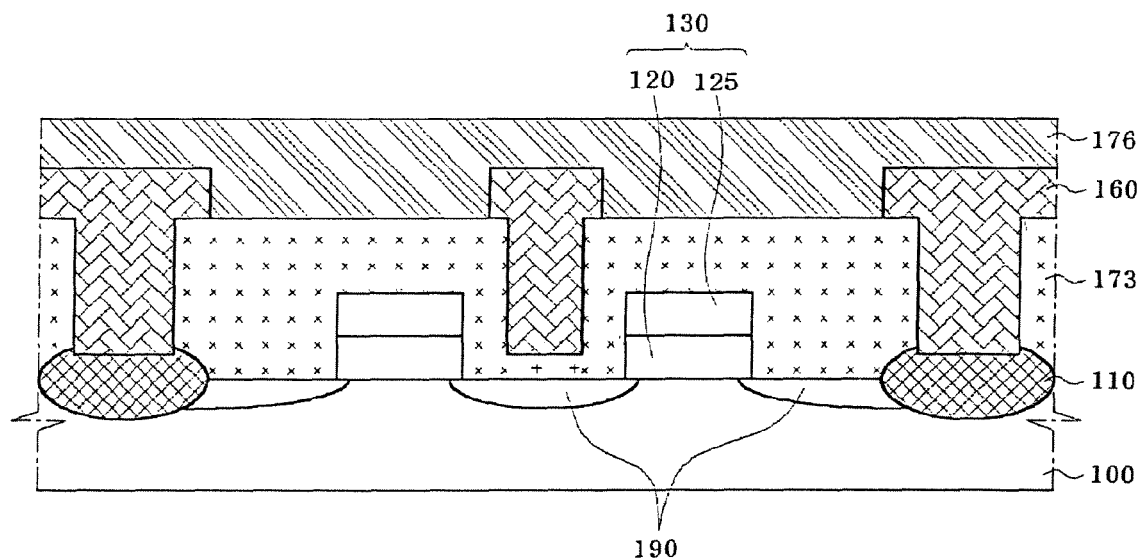

Next, as shown in FIG. 4f, a second interlayer insulating film 176 for preventing the short-circuiting of adjacent conductive patterns 160 and a contact to be formed by the subsequent process is formed on the first interlayer insulating film 173 where the conductive patterns 160 are formed. The second interlayer insulating film 176 is formed using a BPSG film.

Figure 4G:
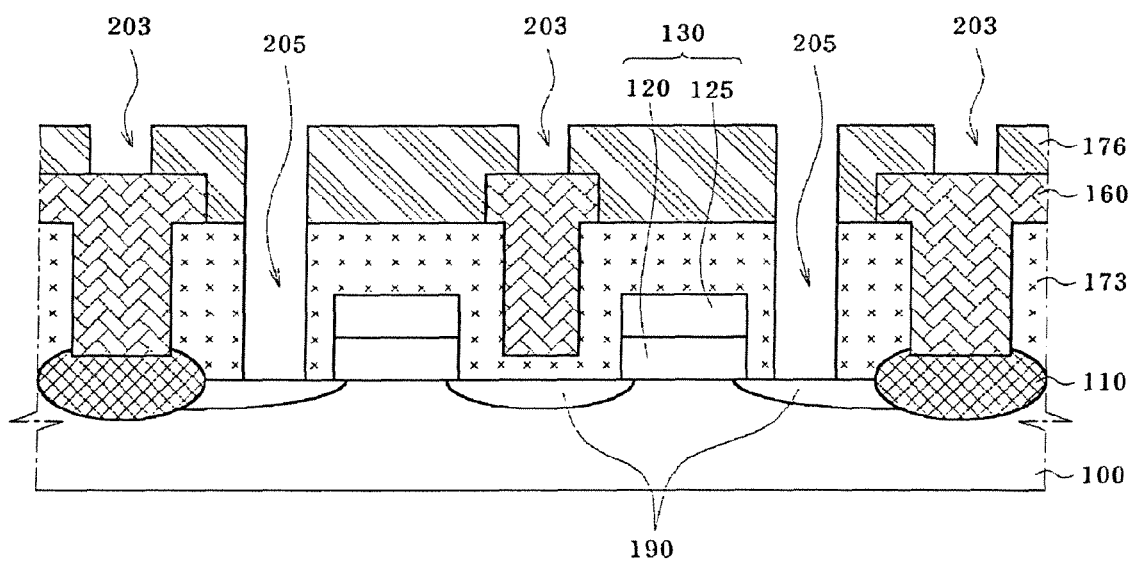

As shown in FIG. 4g, the second interlayer insulating film 176 is selectively etched to form a first contact hole 205 connecting to parts of the source/drain 190 and a second contact hole 203 connecting to the conductive pattern 160.

Figure 4H:
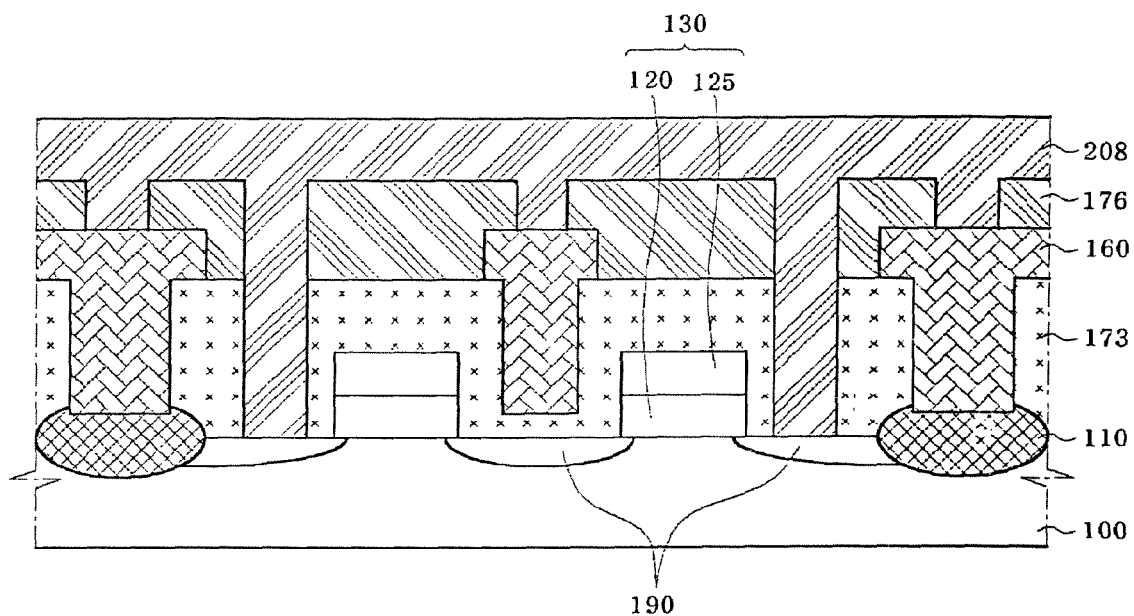

As shown in FIG. 4h, a conductive material 208 is formed on the entire surface of the second interlayer insulating film 176 where the first contact hole 205 and the second contact hole 203 are formed. Preferably, the conductive material 208 is formed at a large thickness so that the first contact hole 205 and the second contact hole 203 can be completely buried.

Figure 4I:
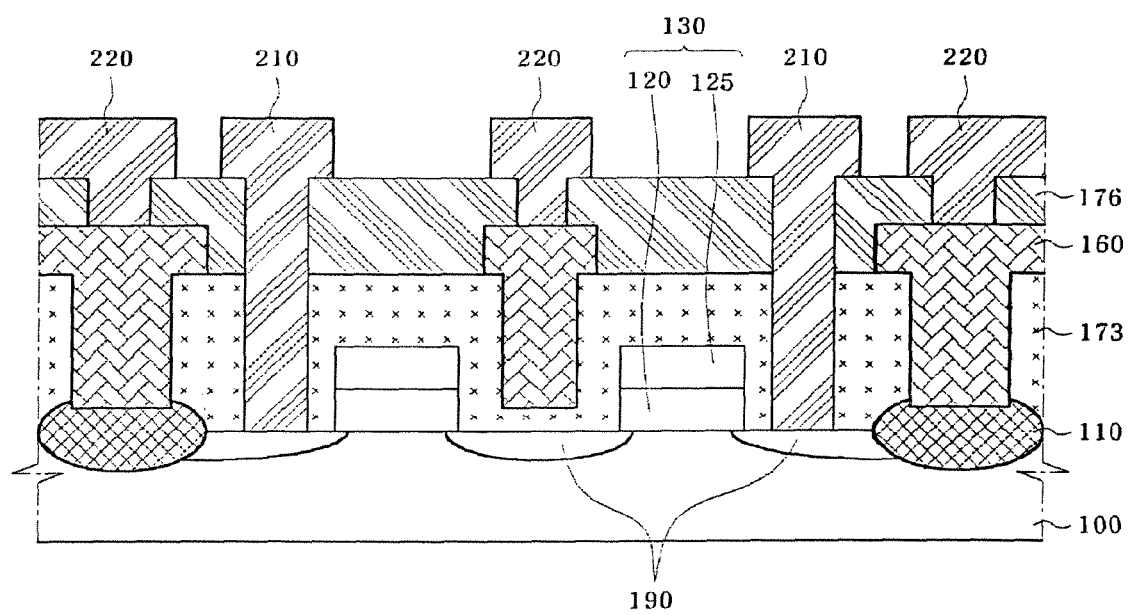

Afterwards, as shown in FIG. 4i, the conductive material is selectively etched by a photographic etching process to form a contact 210 connecting to parts of the source/drain 190 and an electrode pad 220 connecting to the conductive pattern 160. At this time, the electrode pad 220 plays the role of a node capable of applying an external voltage so as to enable the gathering of migratory ions by the conductive pattern 160.

Figure 4J:
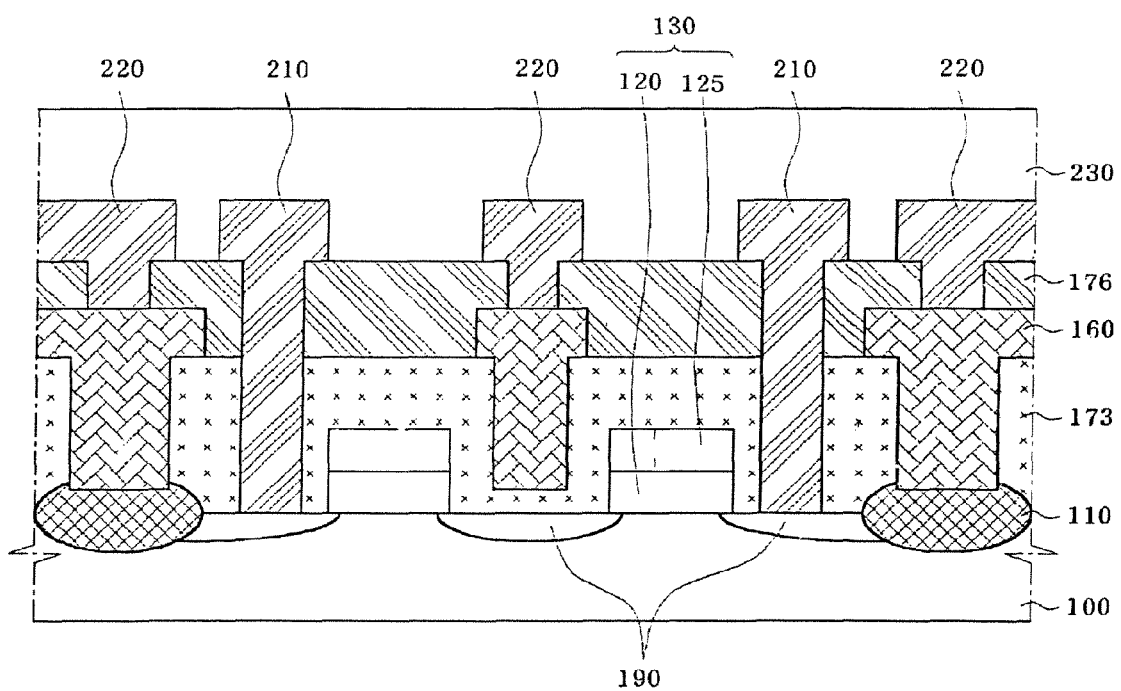

A third interlayer insulating film 230 is formed on the entire surface of the second interlayer insulating film 176 where the contact 210 and the electrode pad 220 are formed for insulating them (refer to FIG. 4j).

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

As described above, according to the present invention, the migratory ions penetrating into the floating gate are gathered by using the conductive material, thereby improving the data storage capacity of the floating gate and increasing the reliability of the device.

What is claimed is:

1. A nonvolatile memory device, comprising:
    a plurality of cell strings arranged in a cell region of a semiconductor substrate, wherein the cell string has a plurality of cell transistors, each cell transistor comprising a gate of a stack type formed on the substrate and a source/drain formed in the substrate at both sides of the gate;
    a first interlayer insulating film formed over the substrate where the cell transistors are formed, wherein the interlayer insulating film covers the gate of a stack type;
    a second interlayer insulating film formed over the first interlayer insulating film;
    a plurality of interconnects formed through the first and second interlayer insulating film, wherein the interconnects are electrically connected to one of the source/drain of the cell transistors;
    a plurality of conductive patterns formed in the first and second interlayer insulating films, wherein the conductive patterns do not contact the source/drain of the cell transistors,
    wherein one of the conductive pattern is disposed to overlap another source/drain, and
    wherein a portion of the first interlayer insulating film is interposed between the one of the conductive patterns and the another source/drain to isolate the one of the conductive patterns from the another source/drain.

2. The nonvolatile memory device of claim 1, wherein the gate of the stack type structure has a structure in which a floating gate and a control gate are sequentially stacked.

3. The nonvolatile memory device of claim 1, wherein the interlayer insulating film is formed of an oxide film.

4. The non-volatile memory device of claim 1, further comprising a BPSG film formed between the interlayer insulating film and the electrode pad.

5. A nonvolatile memory device, comprising:
a semiconductor substrate including active region and isolation region;
first and second gate stacks displaced each other on the active region;
a first junction formed in a portion of the active region between the first and the second gate stacks;
second junctions formed in another portions of the active region relative to the first and second gate stacks opposite to the first junction;
a interlayer insulating film to cover the first and second gate stacks;
first conductive patterns extending through the interlayer insulating film and contacting the second junctions;
second conductive patterns contacting the isolation region; and
a third conductive pattern formed over the first junction by extending partially through the interlayer insulating film, wherein a portion of the interlayer insulating film is disposed between the first junction and the third conductive pattern.

* * * * *